US008951866B2

(12) United States Patent
Lee et al.

(10) Patent No.: US 8,951,866 B2
(45) Date of Patent: Feb. 10, 2015

(54) METHODS OF FABRICATING SEMICONDUCTOR DEVICES AND SEMICONDUCTOR DEVICES INCLUDING THRESHOLD VOLTAGE CONTROL REGIONS

(75) Inventors: Mueng-Ryul Lee, Seoul (KR); Sang-Bae Yi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 956 days.

(21) Appl. No.: 12/656,669

(22) Filed: Feb. 12, 2010

(65) Prior Publication Data
US 2010/0216291 A1 Aug. 26, 2010

(30) Foreign Application Priority Data

Feb. 12, 2009 (KR) .................. 10-2009-0011505

(51) Int. Cl.
  *H01L 21/336* (2006.01)
  *H01L 29/66* (2006.01)
  *H01L 21/28* (2006.01)
  *H01L 29/423* (2006.01)
  *H01L 29/78* (2006.01)
  *H01L 21/8238* (2006.01)

(52) U.S. Cl.
  CPC .... *H01L 29/66621* (2013.01); *H01L 21/28114* (2013.01); *H01L 29/42376* (2013.01); *H01L 29/7834* (2013.01); *H01L 29/66537* (2013.01); *H01L 21/8238* (2013.01)
  USPC ........... 438/270; 438/233; 438/217; 438/273; 257/369; 257/376; 257/374; 257/E21.443

(58) Field of Classification Search
  CPC .............. H01L 29/66621; H01L 29/7834; H01L 29/66537; H01L 21/8238

USPC .......... 438/217, 273, 270, 233; 257/374, 376, 257/E21.443, 369
  See application file for complete search history.

(56) References Cited

U.S. PATENT DOCUMENTS

| 2003/0109089 A1* | 6/2003 | Mitros et al. .................. 438/197 |
| 2005/0133836 A1* | 6/2005 | Seo et al. ...................... 257/288 |
| 2007/0048942 A1* | 3/2007 | Hanson et al. ................ 438/268 |
| 2007/0069268 A1* | 3/2007 | Cho et al. ...................... 257/301 |

FOREIGN PATENT DOCUMENTS

| KR | 10-2006-0104086 A | 10/2006 |
| KR | 10-2007-0001591 A | 1/2007 |
| KR | 10-2007-0002874 A | 1/2007 |

* cited by examiner

*Primary Examiner* — Kimberly Rizkallah
*Assistant Examiner* — Maria Ligai
(74) *Attorney, Agent, or Firm* — Lee & Morse, P.C.

(57) ABSTRACT

A semiconductor device includes a semiconductor substrate including isolation regions defining first and second active regions having a first and second conductivity type, respectively, first threshold voltage control regions in predetermined regions of the first active region, wherein the first threshold voltage control regions have the first conductivity type and a different impurity concentration from the first active region, a first gate trench extending across the first active region, wherein portions of side bottom portions of the first gate trench adjacent to the respective isolation region are disposed at a higher level than a central bottom portion of the first gate trench, and the first threshold voltage control regions remain in the first active region under the side bottom portions of the first gate trench adjacent to the respective isolation region, and a first gate pattern. Methods of manufacturing such semiconductor devices are also provided.

11 Claims, 15 Drawing Sheets

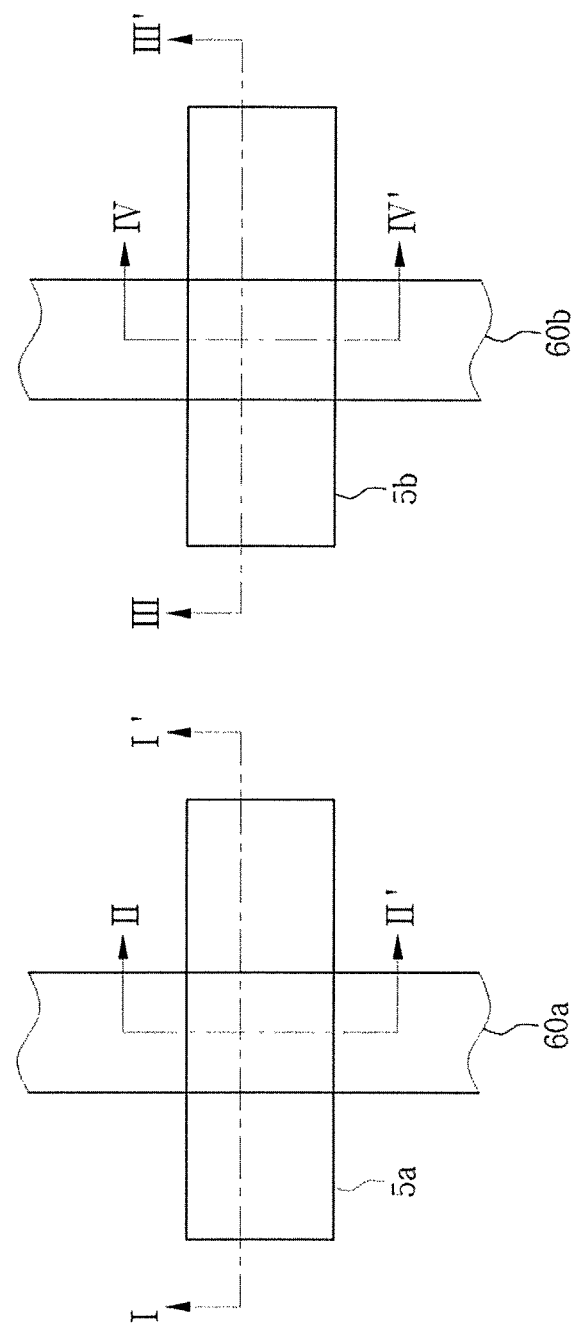

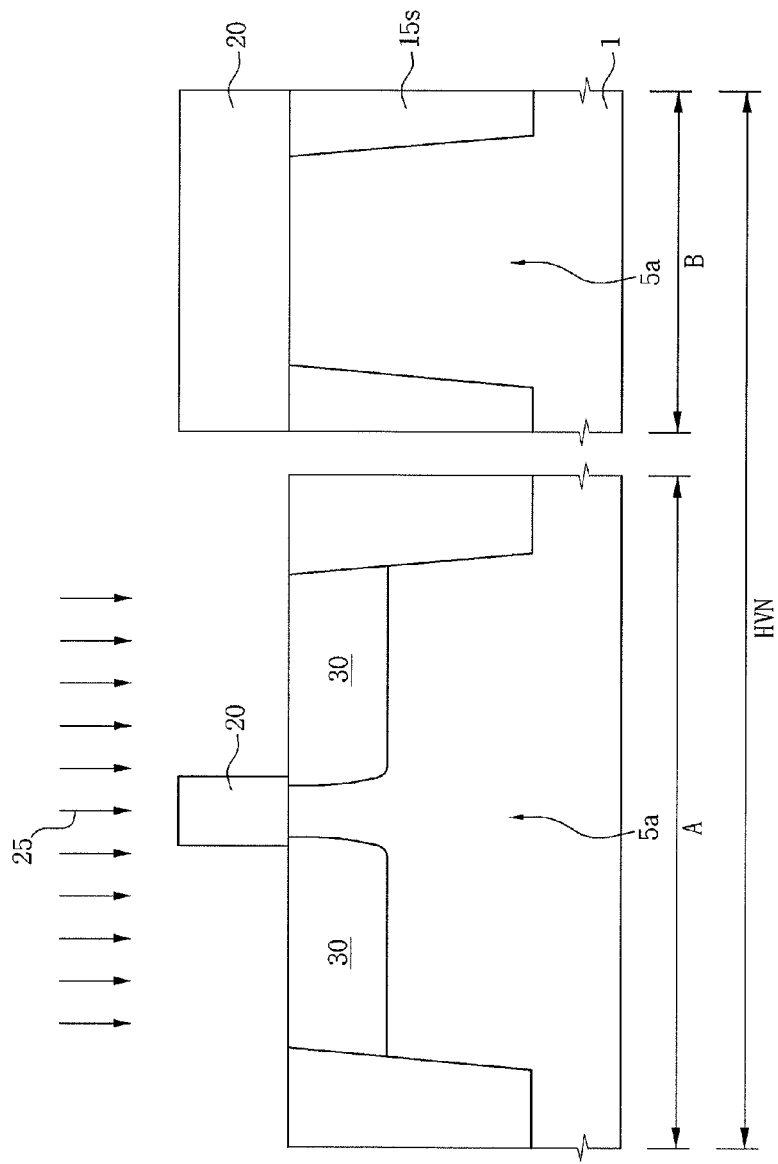

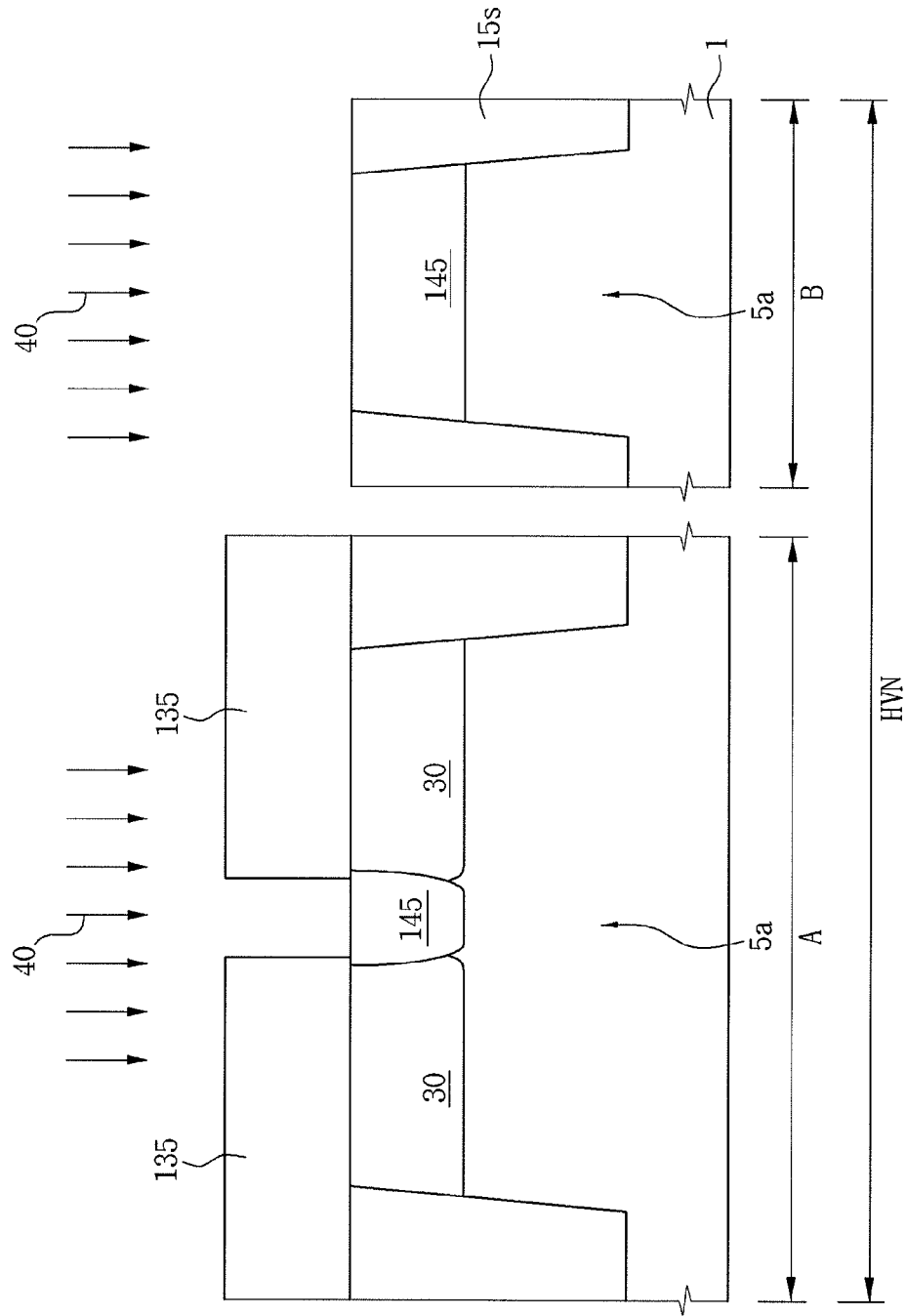

METHODS OF FABRICATING SEMICONDUCTOR DEVICES AND SEMICONDUCTOR DEVICES INCLUDING THRESHOLD VOLTAGE CONTROL REGIONS

BACKGROUND

1. Field

Exemplary embodiments relate to a method of fabricating a semiconductor device and semiconductor devices including a threshold voltage control region.

2. Description of the Related Art

In recent years, semiconductor devices are showing a tendency to become highly integrated. As MOS transistors included in semiconductor devices are being downscaled, performance of the MOS transistors may be degraded due to leakage current.

SUMMARY

Embodiments are therefore directed to methods of fabricating a semiconductor device and semiconductor devices, which substantially overcome one or more of the problems due to the limitations and disadvantages of the related art.

It is therefore a feature of an embodiment to provide methods of fabricating a semiconductor device that may reduce and/or prevent a leakage current of a transistor.

It is therefore separate feature of an embodiment to provide a semiconductor device including a transistor for which leakage current may be reduced and/or prevented.

It is therefore a separate feature of an embodiment to provide methods of fabricating a semiconductor device including a threshold voltage control region.

It is therefore separate feature of an embodiment to provide a semiconductor device including a transistor that includes a threshold voltage control region.

At least one of the above and other features and advantages may be realized by providing a method of fabricating a semiconductor device, including preparing a semiconductor substrate including isolation regions defining first and second active regions, the first active region having a first conductivity type and the second active region having a second conductivity type that is different from the first conductivity type, forming first threshold voltage control regions in predetermined regions of the first active region, wherein the first threshold voltage control regions have the first conductivity type and a different impurity concentration from the first active region, forming a first gate trench extending across the first active region, wherein portions of side bottom portions of the first gate trench adjacent to the respective isolation region are disposed at a higher level than a central bottom portion of the first gate trench, and the first threshold voltage control regions remain in the first active region under the side bottom portions of the first gate trench adjacent to the respective isolation region, and forming a first gate pattern filling the first gate trench and covering the first threshold voltage control regions.

The first threshold voltage control regions may have a higher impurity concentration than the first active region.

The method may include forming first buffer regions in the first active region before or after forming the first threshold voltage control regions, wherein the first buffer regions are of the second conductivity and are formed in the first active region on opposing sides of the first gate pattern.

The method may include forming second buffer regions in the second active region while forming the first threshold voltage control regions, wherein the second buffer regions are of the first conductivity type, forming second threshold voltage control regions in edge portions of the second active region adjacent to the respective isolation region while forming the first buffer regions, wherein the second threshold voltage control regions are of the second conductivity type and have a higher impurity concentration than the second active region, forming a second gate trench extending across the second active region while forming the first gate trench, wherein side bottom portions of the second gate trench adjacent to the respective isolation region are disposed at a higher level than a central bottom portion of the second gate trench, and the second threshold voltage control regions remain in the second active region under the side bottom portions of the second gate trench adjacent to the respective isolation region, and forming a second gate pattern filling the second gate trench and covering the second threshold voltage control regions while forming the first gate pattern, wherein the second buffer regions are formed in the second active region on opposing sides of the second gate pattern simultaneously with the first threshold voltage control regions, and the second threshold voltage control regions are formed simultaneously with the first buffer regions.

The first gate pattern may include a first gate dielectric layer formed on an inner wall of the first gate trench and a first gate electrode disposed on the first gate dielectric layer, and the second gate pattern includes a second gate dielectric layer formed on an inner wall of the second gate trench and a second gate electrode disposed on the second gate dielectric layer.

The method may include forming first source and drain regions in the first active region on the opposing sides of the first gate pattern.

The first source and drain regions may be of the second conductivity type and have a higher impurity concentration than the first buffer regions.

The method may include forming second source and drain regions in the second active region on the opposing sides of the second gate pattern.

The second source and drain regions may be of the first conductivity type and have a higher impurity concentration than the second buffer regions.

At least one of the first and second active regions defined by the isolation region and the first and second gate trenches may have an inclined sidewall.

At least one of the above and other features and advantages may be separately realized by providing a semiconductor device, including a semiconductor substrate including isolation regions defining first and second active regions, the first active region having a first conductivity type and the second active region having a second conductivity type that is different from the first conductivity type, first threshold voltage control regions in predetermined regions of the first active region, wherein the first threshold voltage control regions have the first conductivity type and a different impurity concentration from the first active region, a first gate trench extending across the first active region, wherein portions of side bottom portions of the first gate trench adjacent to the respective isolation region are disposed at a higher level than a central bottom portion of the first gate trench, and the first threshold voltage control regions remain in the first active region under the side bottom portions of the first gate trench adjacent to the respective isolation region, and a first gate pattern filling the first gate trench and covering the first threshold voltage control regions.

The semiconductor substrate may extend along a plane, and the side bottom portions of the first gate trench may extend along a direction other than a direction perpendicular to the plane along which the semiconductor substrate extends.

The first gate trench may have a bowl-like cross sectional shape between the first threshold voltage control regions.

An upper portion of the first gate trench may be wider than a lower portion of the first gate trench.

The first threshold voltage control regions may have a triangular-like cross-sectional shape.

The first gate trench may extend deeper into the semiconductor substrate than the first threshold voltage control regions.

The first threshold voltage control regions may be sandwiched between respective upper portions of the side bottom portions of the first gate trench and the respective isolation regions, and a respective portion of the first active region may be sandwiched between respective lower portions of the side bottom portions of the first gate trench and the respective isolation regions.

The semiconductor device may include first buffer regions in the first active region, wherein the first buffer regions are of the second conductivity and may be in the first active region on opposing sides of the first gate pattern.

The semiconductor device may include second threshold voltage control regions in edge portions of the second active region adjacent to the respective isolation region, wherein the second threshold voltage control regions may be of the second conductivity type and have a higher impurity concentration than the second active region, a second gate trench extending across the second active region, wherein side bottom portions of the second gate trench adjacent to the respective isolation region are disposed at a higher level than a central bottom portion of the second gate trench, and the second threshold voltage control regions remain in the second active region under the side bottom portions of the second gate trench adjacent to the respective isolation region, and a second gate pattern filling the second gate trench and covering the second threshold voltage control regions.

The semiconductor device may include second buffer regions in the second active region, wherein the second buffer regions are of the first conductivity type, wherein the second buffer regions are in the second active region on opposing sides of the second gate pattern.

BRIEF DESCRIPTION OF THE DRAWINGS

The above and other features and advantages will become more apparent to those of ordinary skill in the art by describing in detail exemplary embodiments with reference to the attached drawings, in which:

FIG. 1 illustrates a plan view of an active region and a gate pattern of exemplary semiconductor devices; and FIGS. 2A-2C, 3A-3C, 4A, 4B, 5A, 5B, 6A, 6B, 7A, and 7B illustrate cross-sectional views of stages in exemplary methods of forming semiconductor devices.

DETAILED DESCRIPTION

Figure 2B:
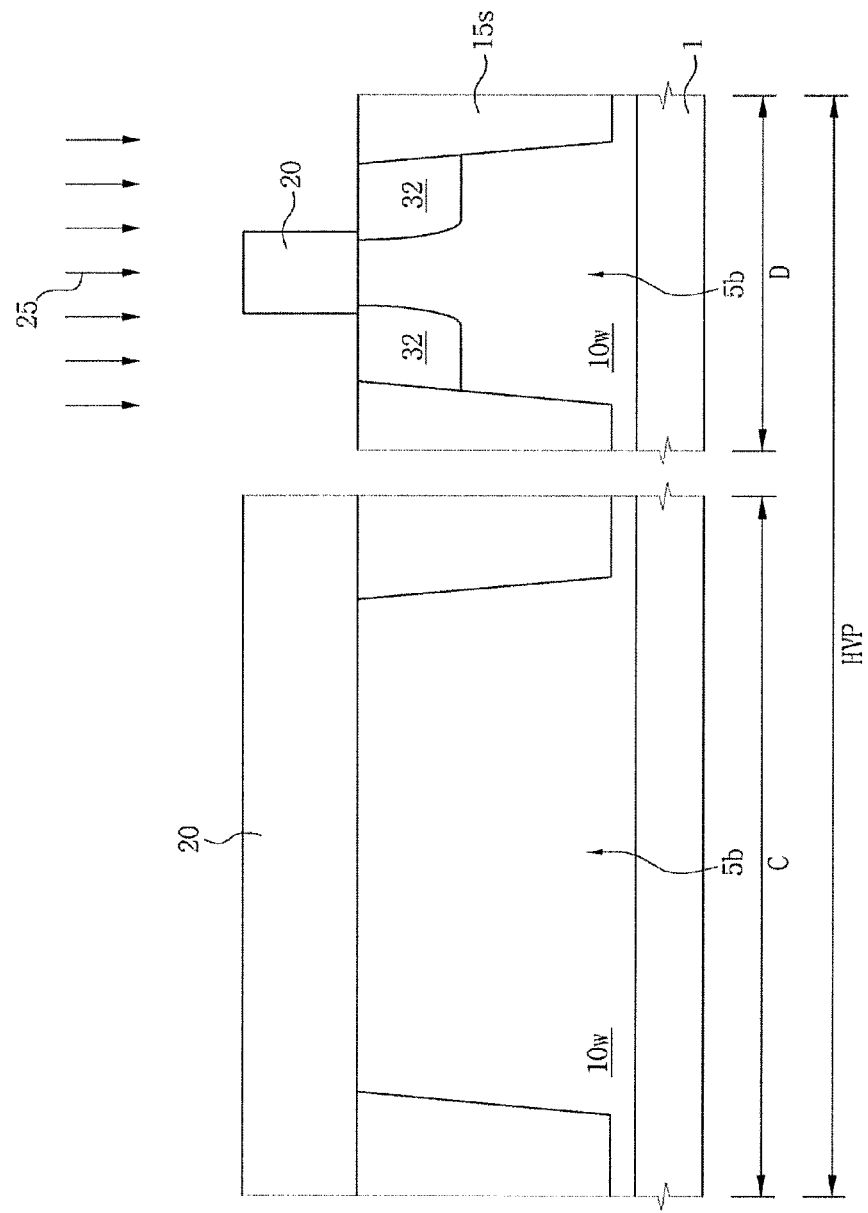

Korean Patent Application No. 10-2009-0011505, filed on Feb. 12, 2009, in the Korean Intellectual Property Office, and entitled: "Method of Fabricating Semiconductor Device Having Threshold Voltage Control Region," is incorporated by reference herein in its entirety.

Exemplary embodiments will now be described more fully with reference to the accompanying drawings in which some example embodiments are shown. This inventive concept may, however, be embodied in different forms and should not be construed as limited to the example embodiments set forth herein. Rather, these exemplary embodiments are provided so that this disclosure is thorough and complete and fully conveys the scope of the inventive concept to one skilled in the art. In the drawings, the thicknesses of layers and regions may be exaggerated for clarity. It will also be understood that when an element is referred to as being "on" another element, it can be directly on the other element or intervening elements may also be present. Like numbers refer to like elements throughout the specification.

FIG. 1 illustrates plan views of an active region and gate pattern of exemplary semiconductor devices. FIGS. 2A-2C, 3A-3C, 4A, 4B, 5A, 5B, 6A, 6B, 7A, and 7B illustrate cross-sectional views of stages in exemplary methods of forming semiconductor devices. In FIGS. 2A, 3A, 3C, 4A, 5A, 6A, and 7A, reference character A denotes a region taken along line I-I' of FIG. 1, and reference character B denotes a region taken along line II-II' of FIG. 1. In FIGS. 2B, 2C, 3B, 4B, 5B, 6B, and 7B, reference character C denotes a region taken along line of FIG. 1, and reference character D denotes a region taken along line IV-IV' of FIG. 1. Also, in FIGS. 2A, 3A, 3C, 4A, 5A, 6A, and 7A, reference character HVN denotes a first device region. In FIGS. 2B, 2C, 3B, 4B, 5B, 6B, and 7B, reference character HVP denotes a second device region.

Exemplary methods for fabricating semiconductor devices will now be described with reference to FIGS. 1 through 7B.

Referring to FIGS. 1, 2A, and 2B, a semiconductor substrate 1 may include a first device region HVN and a second device region HVP. The semiconductor substrate 1 may be, e.g., a bulk semiconductor wafer or a silicon-on-insulator (SOI) wafer, which includes a semiconductor material, e.g., silicon.

The first and second device regions HVN and HVP of the semiconductor substrate 1 may include well regions according to a type of device, e.g., NMOS transistor and/or PMOS transistor, to be formed thereon. For example, referring to FIG. 2B, a second device well region 10w of a different conductivity type from the semiconductor substrate 1 may be formed in the second device region HVP. The first device region HVN may be a first high-voltage transistor region, and the second device region HVP may be a second high-voltage transistor region. One of the first and second high-voltage transistor regions HVN and HVP may be an NMOS transistor region, and the other thereof may be a PMOS transistor region.

An isolation region 15s defining first and second active regions 5a and 5b may be formed in the semiconductor substrate 1. The isolation region 15s may be formed using a trench isolation technique. The first active region 5a may be defined in the first device region HVN, while the second active region 5b may be defined in the second device region HVP.

The first active region 5a of the semiconductor substrate 1 may exhibit a first conductivity type. The second active region 5b, more particularly, the second device well region 10w, may exhibit a second conductivity type different from the first conductivity type. For example, the first active region 5a may be of a p type, and the second device well region 10w may be of an n type. Alternatively, the first active region 5a may be an n type, and the second device well region 10w may be a p type. Thus, the first and second active regions 5a and 5b may have different conductivity types.

Referring to FIGS. 2A and 2B, a first mask pattern 20 may be formed to expose predetermined regions of the first and second active regions 5a and 5b. More specifically, referring to FIG. 2A, the first mask pattern 20 may be formed on and across the first active region 5a. Portions of the first active region 5a may be exposed on both sides of the first mask pattern 20. Referring to FIG. 2B, the first mask pattern 20 may be formed on the second active region 5b to partially expose edge portions of the second active region 5b adjacent to the isolation region 15s. In such cases, the edge portions of the second active region 5b exposed by the first mask pattern 20 may be disposed opposite each other across the first mask pattern 20.

Referring to FIGS. 2A and 2B, a first ion implantation process 25 may be performed, thereby forming a first buffer region 30 in the first active region 5a exposed by the first mask pattern 20 and forming second threshold voltage control regions 32 in the second active region 5b. In other words, the first buffer region 30 and the second threshold voltage control regions 32 may be formed using the same ion implantation process, that is, the first ion implantation process 25.

The first buffer region 30 may have a different conductivity type from the first active region 5a. For example, when the first active region 5a is a p type, the first buffer region 40 may be an n type. The second threshold voltage control regions 32 may have the same conductivity type as the second device well region 10w and a higher impurity concentration than the second device well region 10w.

Figure 2C:
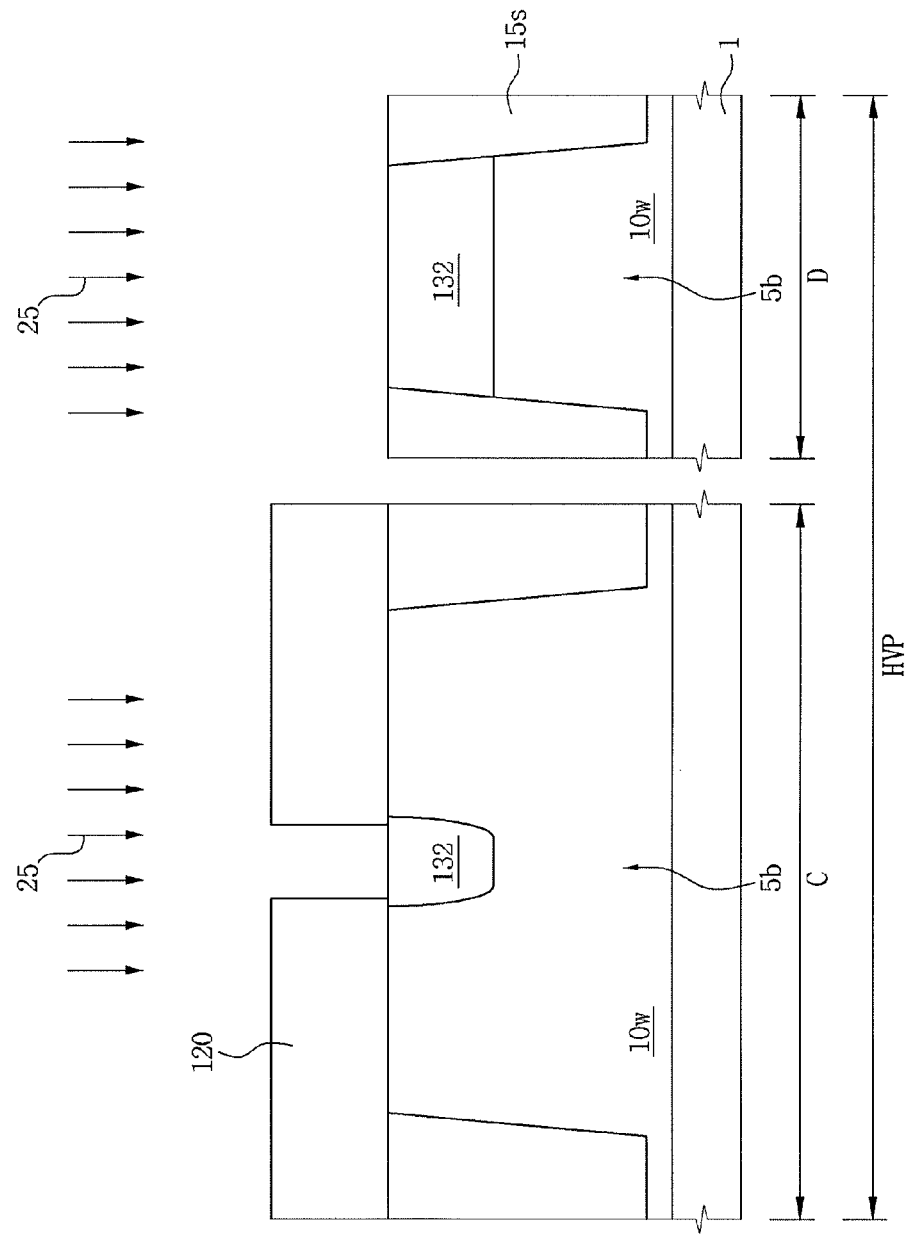

Embodiments are not limited to the mask pattern 20 of FIGS. 2A and/or 2B. For example, in some embodiments, as shown in FIG. 2C, a first mask pattern 120 may be employed. More specifically, the first mask pattern 20 of FIG. 2B may be formed on the second active region 5b and may have an opening exposing only a portion of the edge portion of the second active region 5b adjacent to the isolation region 15s. More particularly, as compared to the first mask pattern 20 of FIG. 2B, the first mask pattern 120 of FIG. 2C may be formed to have an opening extending across the second active region 5b.

Referring to FIGS. 2B and 2C, the first mask pattern 20, 120 of FIGS. 2B, 2C, respectively, may partially expose the respective edge portions of the second active region 5b adjacent to the isolation region 15s. When the first mask pattern 120 of FIG. 2C is employed, a second threshold voltage control region 132 may be formed in an exposed region of the second active region 5b using the first ion implantation process 25. Like the second threshold voltage control region 32 of FIG. 2B, the second threshold voltage control region 132 of FIG. 2C also may be formed in a portion of the edge portion of the second active region 5b adjacent to the isolation region 15s. Thus, other than the pattern and/or size, the first mask patterns 20, 120 and the second threshold voltage control regions 32, 132 may be substantially the same. Therefore, a detailed description of the first mask pattern 120 and the second threshold voltage control region 132 of FIG. 2C will not be provided.

Figure 3A:
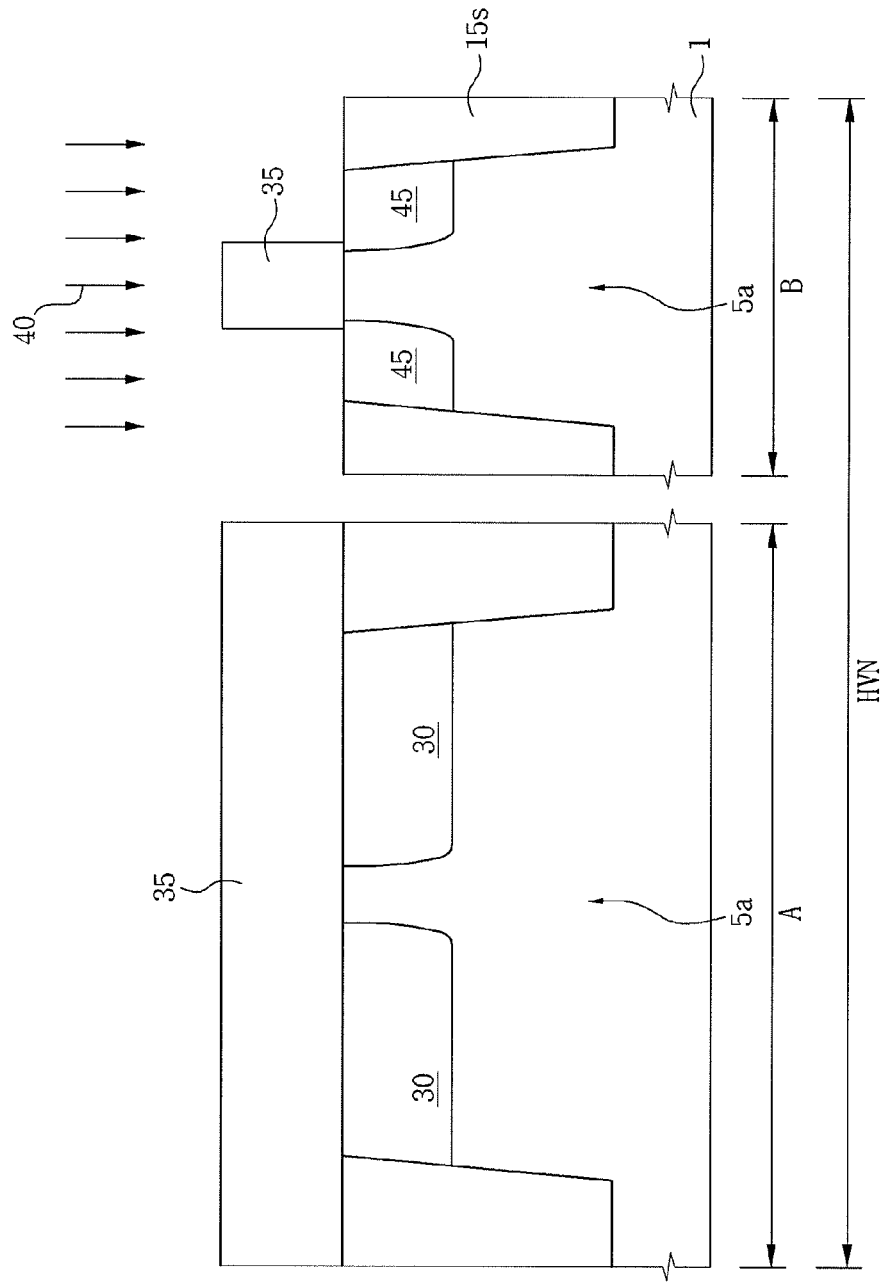
Figure 3B:
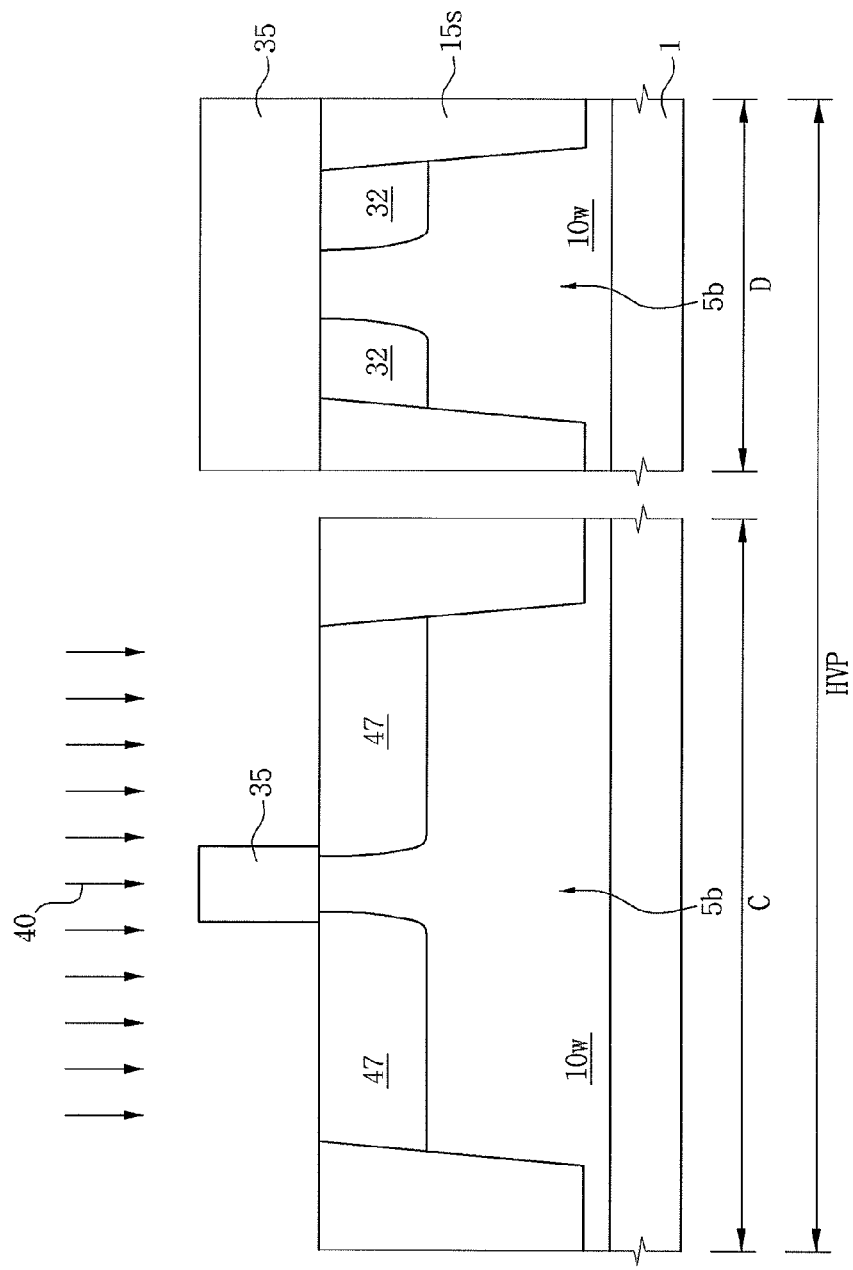

Referring to FIGS. 1, 3A, and 3B, the first mask pattern 20 may be removed. A second mask pattern 35 may be formed to expose predetermined regions of the first and second active regions 5a and 5b. More specifically, referring to FIG. 3A, the second mask pattern 35 may be formed on the first active region 5a to partially expose edge portions of the first active region 5a adjacent to the isolation region 15s. In such cases, the edge portions of the first active region 5a exposed by the second mask pattern 35 may be disposed opposite each other across the second mask pattern 35. Referring to FIG. 3B, the second mask pattern 35 may be formed on and across the second active region 5b. Portions of the second active region 5b may be exposed on both sides of the second mask pattern 35.

A second ion implantation process 40 may then be performed. Referring to FIG. 3A, a first threshold voltage control regions 45 may be formed in the first active region 5a. Referring to FIG. 3B, a second buffer region 47 may be formed in the second active region 5b exposed by the second mask pattern 35. That is, the first threshold voltage control regions 45 and the second buffer region 47 may be formed using the same ion implantation process, that is, the second ion implantation process 40.

The first threshold voltage control regions 45 may have the same conductivity type as the first active region 5a and a higher impurity concentration than the first active region 5a. The second buffer region 47 may exhibit a different conductivity type from the second active region 5b. For example, when the second active region 5b is a p type, the second buffer region 47 may be an n type.

Although FIGS. 2A, 2B, 3A and 3B illustrate the first ion implantation process 25 using the first mask pattern 20 as an ion implantation mask being performed before the second ion implantation process using the second mask pattern 35 as an ion implantation mask, embodiments are not limited thereto. For example, the ion implantation process 25 of FIGS. 2A and 2B using the first mask pattern 20 as the ion implantation mask may be performed after the ion implantation process 40 using the second mask pattern 35 as the ion implantation mask.

Embodiments are not limited to the mask pattern 35 of FIGS. 3A and/or 3B. For example, in some embodiments, as shown in FIG. 3C, a second mask pattern 135 may be employed. More specifically, e.g., the second mask pattern 35 of FIG. 3A may be formed on the first active region 5a to have an opening exposing only a portion of the edge portions of the first active region 5a adjacent to the isolation region 15s. In comparison, the second mask pattern 135 of FIG. 3C may be formed to have an opening, e.g., extending across the first active region 5a. Like the second mask pattern 35 of FIG. 3A, the second mask pattern 135 of FIG. 3C may partially expose the edge portions of the first active region 5a adjacent to the isolation region 15s. Also, when the second mask pattern 135 of FIG. 3C is adopted, a first threshold voltage control region 145 may be formed in an exposed region of the first active region 5a using the second ion implantation process 40. Referring to FIGS. 3A and 3C, like the first threshold voltage control region 45 of FIG. 3A, the first threshold voltage control region 145 of FIG. 3C may be formed in a portion of the edge portion of the first active region 5a adjacent to the isolation region 15s. Thus, other than the pattern and/or size, the second mask patterns 35, 135 and the first threshold voltage control regions 45, 145 may be substantially the same. Therefore, a detailed description of the second mask pattern 135 and the first threshold voltage control region 145 of FIG. 3C will not be provided.

Figure 4A:
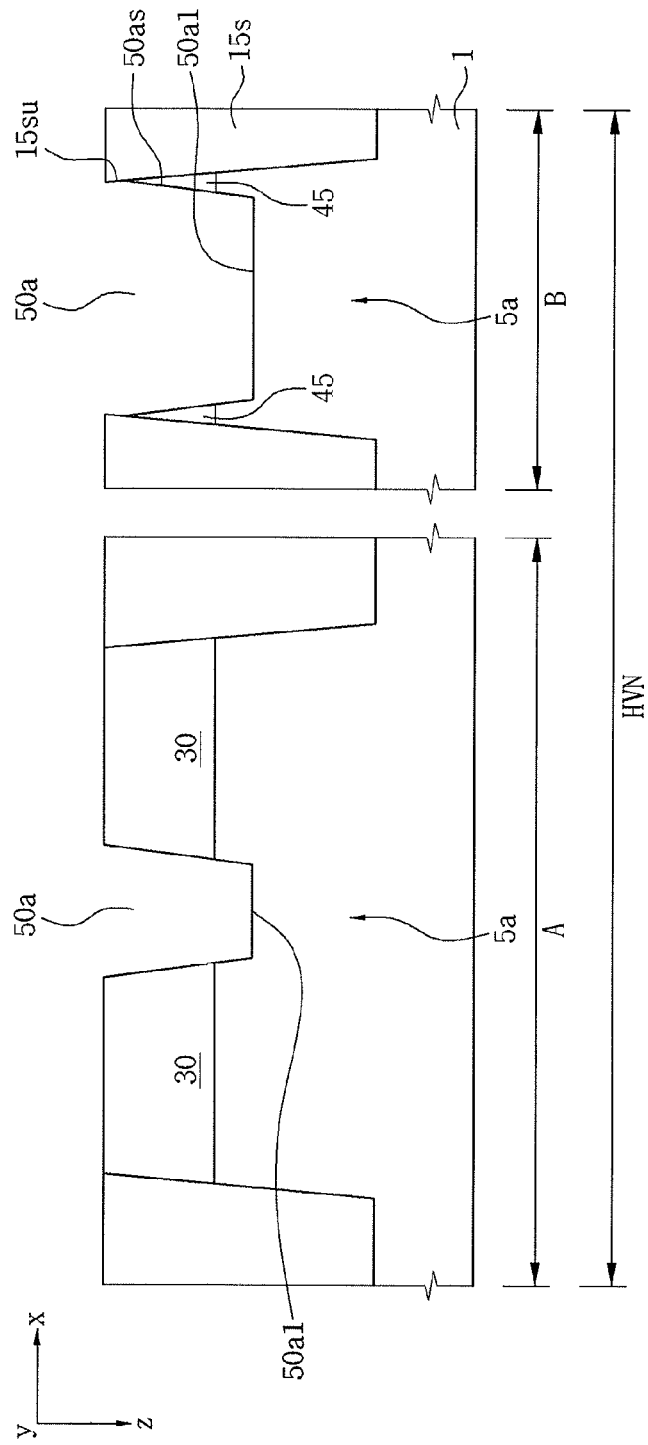
Figure 4B:
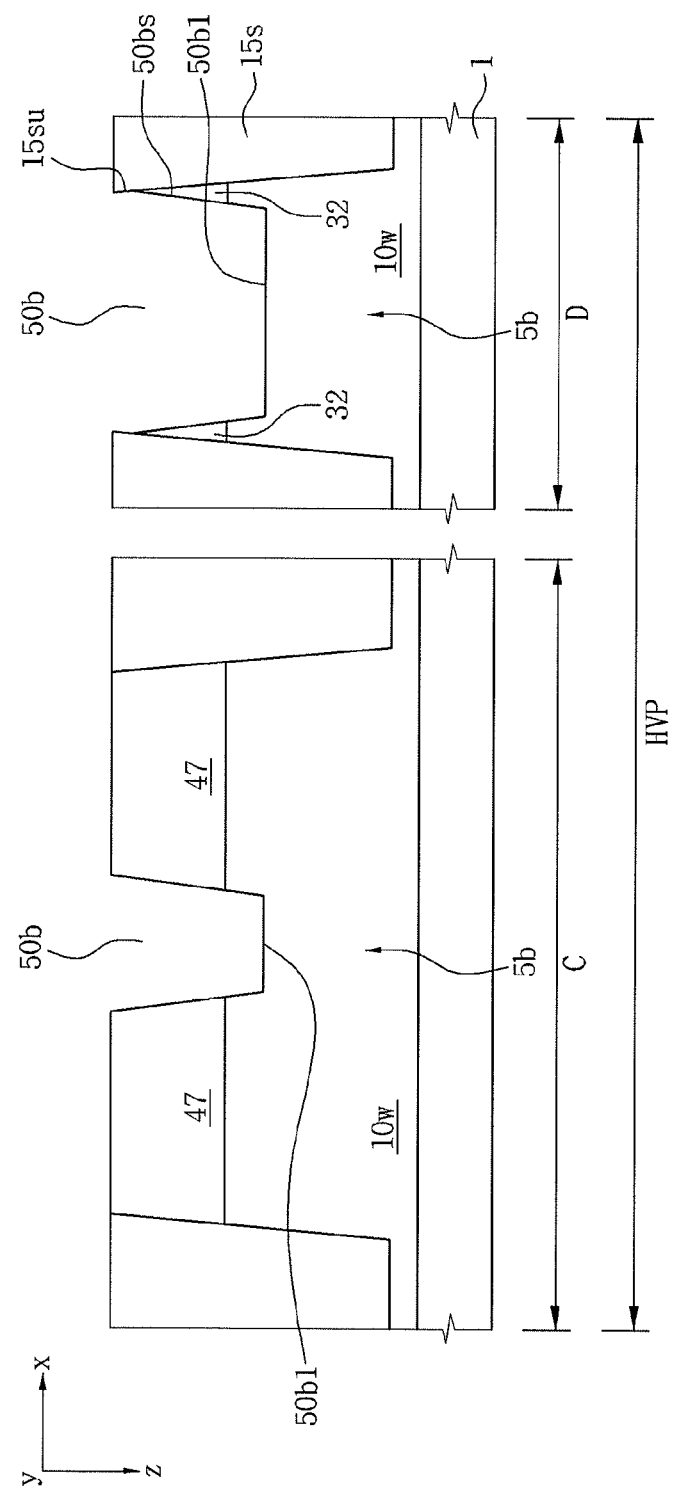

Referring to FIGS. 4A, and 4B, the second mask pattern 35 may be removed. Referring to FIG. 4A, a first gate trench 50a may be formed across the first active region 5a. Referring to FIG. 4B, a second gate trench 50b may be formed across the second active region 5b. The first and second gate trenches 50a and 50b may be formed according to techniques known to those of ordinary skill in the art, e.g., may include forming a gate mask (not shown) including a first opening and a second opening, respectively. The first opening may expose a central portion of the first active region 5a and extend between corresponding ones of the isolation region 15s. The second opening may expose a central portion of the second active region 5b and may extend between corresponding ones of the isolation regions 15s. Thereafter, the first and second active regions 5a and 5b may be etched using the gate mask as an etch mask, thereby forming the first and second gate trenches 50a and 50b. Afterwards, the gate mask may be removed.

Referring to FIGS. 4A and 4B, the first gate trench 50a and/or the second gate trench 50b may completely extend between upper portions of sides 15su of the corresponding isolation regions 15s, i.e., may expose upper portions of the sides 15us of the corresponding ones of the isolation regions 15s, e.g., along line II-II and line IV-IV of FIG. 1, respectively. Lower portions of the first gate trench 50a and/or the second gate trench 50b may only partially extend between the corresponding isolation regions 15s.

More particularly, referring still to FIGS. 4A and 4B, at least one of the first and second active regions 5a and 5b defined by the isolation region 15s and the first and second gate trenches 50a and 50b may have an inclined sidewall and/or sidewall portions. In embodiments, e.g., the first gate trench 50a and/or the second gate trench 50b may have a bowl like cross-sectional shape, e.g., a width of an upper portion may be wider than a width of a lower portion of the first gate trench 50a and/or the second gate trench 50b. That is, e.g., the first gate trench 50a and the second gate trench 50b may have a cross-sectional shape along line II-II or IV-IV of FIG. 1 including a plurality of bottom portions extending along different angles relative to each other. For example, e.g., the first gate trench 50a and the second gate trench 50b may include a central bottom portion 50al, 50bl, and a plurality of side bottom portions 50as, 50bs, respectively.

The central bottom portions 50al, 50bl of the first gate trench 50a and the second gate trench 50b may only partially extend between the corresponding ones of the isolation regions 15s, e.g., along line II-II and IV-IV of FIG. 1, respectively. The side bottom portions 50as, 50bs of the first and second gate trenches 50a, 50b may extend deeper, i.e., further along a z-axis, than the respective first and second threshold voltage control regions 45, 145, 32, 132 relative to the semiconductor substrate 1.

More particularly, referring to FIGS. 4A and 4B, portions of the side bottom portions 50as, 50bs of the first gate trench 50a and the second gate trench 50b, respectively, facing the respective isolation region 15s may be disposed at a higher level relative to the semiconductor substrate 1 than the central bottom portion 50al, 50bl of the first gate trench 50a and the second gate trench 50b, respectively. Portions of the first threshold voltage control region 45 may remain in the first active region 5a under the side bottom portions 50as of the first gate trench 50a facing the isolation region 15s. Portions of the second threshold voltage control region 32 may remain in the second active region 5b under the side bottom portions 50bs of the second gate trench 50b facing the isolation region 15s. It should be understood that while the side bottom portions 50as, 50bs may be illustrated in FIGS. 5A and 5B as gradually inclining sidewalls, embodiments are not limited thereto.

In embodiments, the side bottom portions 50as, 50bs may generally extend along a direction and/or plane other than a direction and/or plane, e.g., z-direction, that extends perpendicular to a plane along which the substrate 1 extends, e.g., x-y plane. It should be understood that embodiments are not limited to the exemplary embodiments illustrated in FIGS. 1-7B. For example, in some embodiments, the side bottom portions 50as, 50bs may extend along a direction, e.g., z-direction, and/or plane perpendicular to the plane, e.g., x-y plane, along which the semiconductor substrate 1 extends, the side bottom portions 50as, 50bs may be inclined such that, e.g., an uppermost portion thereof and a lowermost portion thereof are not aligned along the z-direction.

Figure 5A:
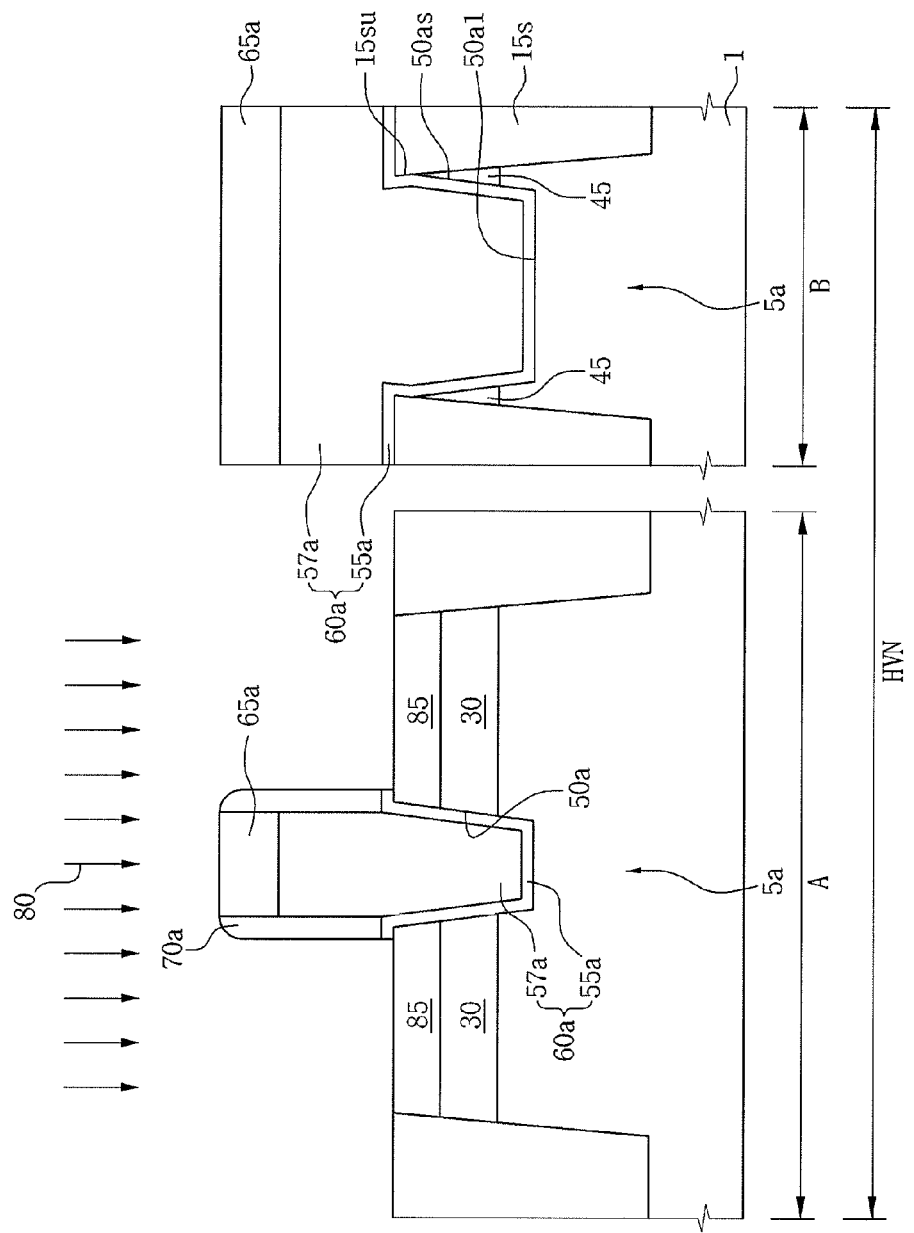
Figure 5B:
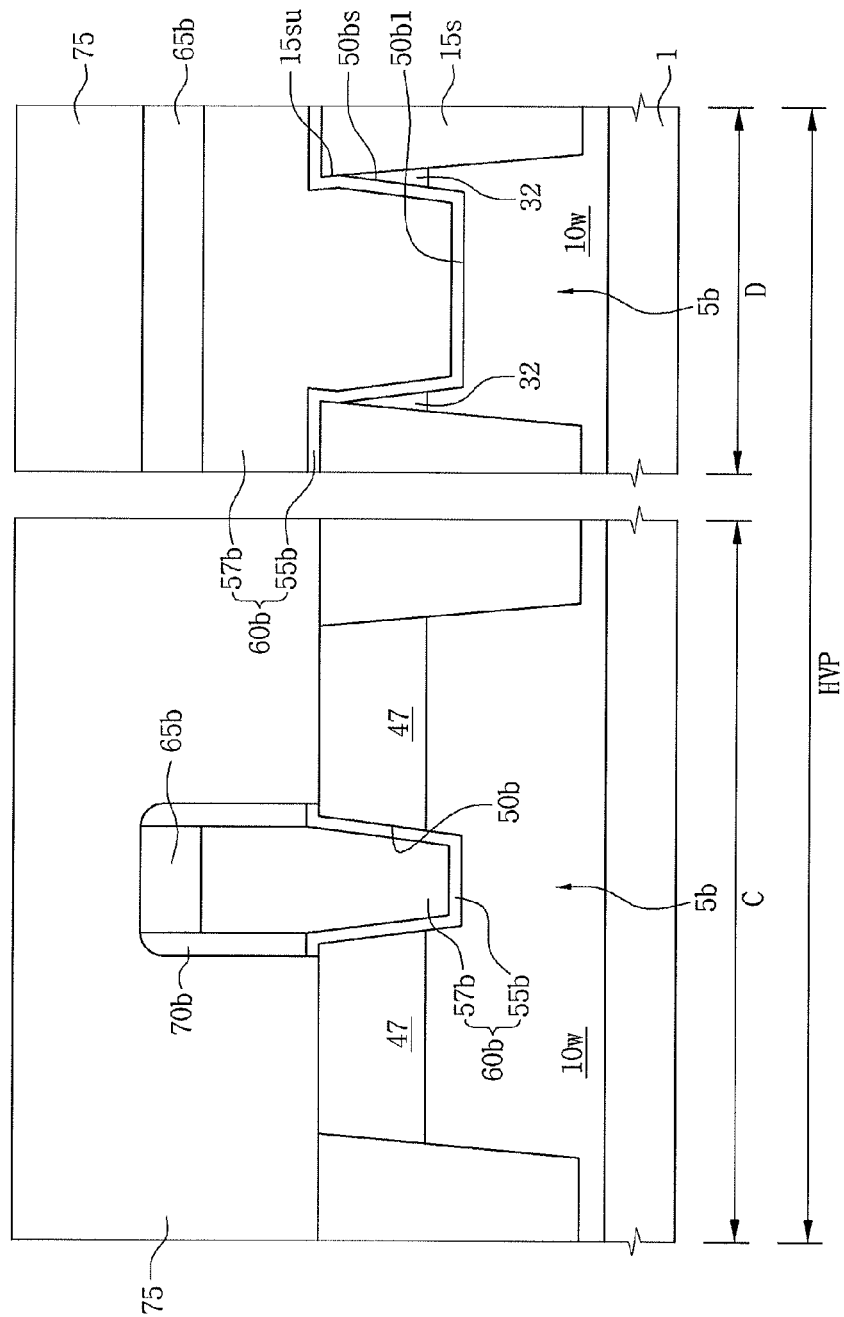

Referring, e.g., to FIGS. 5A and 5B, in embodiments, the first and/or the second threshold voltage control regions 45, 32 may have a triangular-like cross sectional shape. More particularly, e.g., the first and second threshold voltage control regions 45, 32 may be sandwiched between respective upper portions of the side bottom portions 50as, 50bs of the first and second gate trenches 50a, 50b and the respective isolation regions 15s. Respective portions of the first and second active regions 5a, 5b may be sandwiched between respective lower portions of the side bottom portions 50as, 50bs of the first and second gate trenches 50a, 50b and the respective isolation regions.

Referring to FIGS. 1, 5A, and 5B, a gate dielectric layer may be formed on the semiconductor substrate 1 including the first and second gate trenches 50a and 50b. For example, a first gate dielectric layer 55a may be formed on the central bottom portion 50al and the side bottom portions 50as of the first gate trench 50a. A second gate dielectric layer 55b may be formed on the central bottom portion 50bl and the side bottom portions 50bs of the second gate trench 50b. Each of the first and second gate dielectric layers 55a and 55b may include, e.g., a silicon oxide layer and/or a high-k dielectric layer.

A first gate electrode 57a filling the first gate trench 50a may be formed on the first gate dielectric layer 55a. A second gate electrode 57b filling the second gate trench 50b may be formed on the second gate dielectric layer 55b. The first gate dielectric layer 55a and the first gate electrode 57a may be defined as a first gate pattern 60a, and the second gate dielectric layer 55b and the second gate electrode 57b may be defined as a second gate pattern 60b.

The first and second gate patterns 60a and 60b may at least partially fill the first and second gate trenches 50a and 50b, respectively. In embodiments, the first and second gate patterns 60a and 60b may fill the first and second gate trenches 50a and 50b, respectively, and may protrude to above the semiconductor substrate 1, e.g., protrude higher than top surfaces of the first and second active regions 5a and 5b, respectively. More particularly, e.g., formation of the first and second gate electrodes 57a and 57b may include forming a gate conductive layer on a surface, e.g., an entire surface, of the semiconductor substrate 1 including the first and second gate dielectric layers 55a and 55b. Thereafter, first and second insulating masks 65a and 65b may be formed on the gate conductive layer. The gate conductive layer may be etched using the first and second insulating masks 65a and 65b as etch masks. In such cases, before forming the first and second insulating masks 65a and 65b, the gate conductive layer may be planarized, and a conductive material layer, which is highly electrically conductive relative to the gate conductive layer, may be formed on the planarized gate conductive layer. Each of the first and second gate electrodes 57a and 57b may include, e.g., a silicon (Si) layer, a silicon-germanium (SiGe) layer, a Ge layer, a metal silicide layer, a metal nitride layer, and/or a metal layer, etc.

A spacer insulating layer (not shown) may be formed on the semiconductor substrate 1 including the first and second gate electrodes 57a and 57b. The spacer insulating layer may be etched using an anisotropic etching process. As a result, a first insulating spacer 70a may be formed on sidewalls of the first gate electrode 57a and the first insulating mask 65a that may be stacked sequentially. A second insulating spacer 70b may be formed on sidewalls of the second gate electrode 57b and the second insulating mask 65b that may be stacked sequentially.

A first photoresist pattern 75 may be formed to cover the second device region HVP of the semiconductor substrate 1 and expose the first device region HVN. A third ion implantation process 80 may be performed using the first photoresist pattern 75 as an ion implantation mask, thereby forming first source and drain regions 85 in the first active region 5a on both sides of the first gate pattern 60a. The first source and drain regions 85 may have the same conductivity type as the first buffer region 30 and a higher impurity concentration than the first buffer region 30.

Figure 6A:
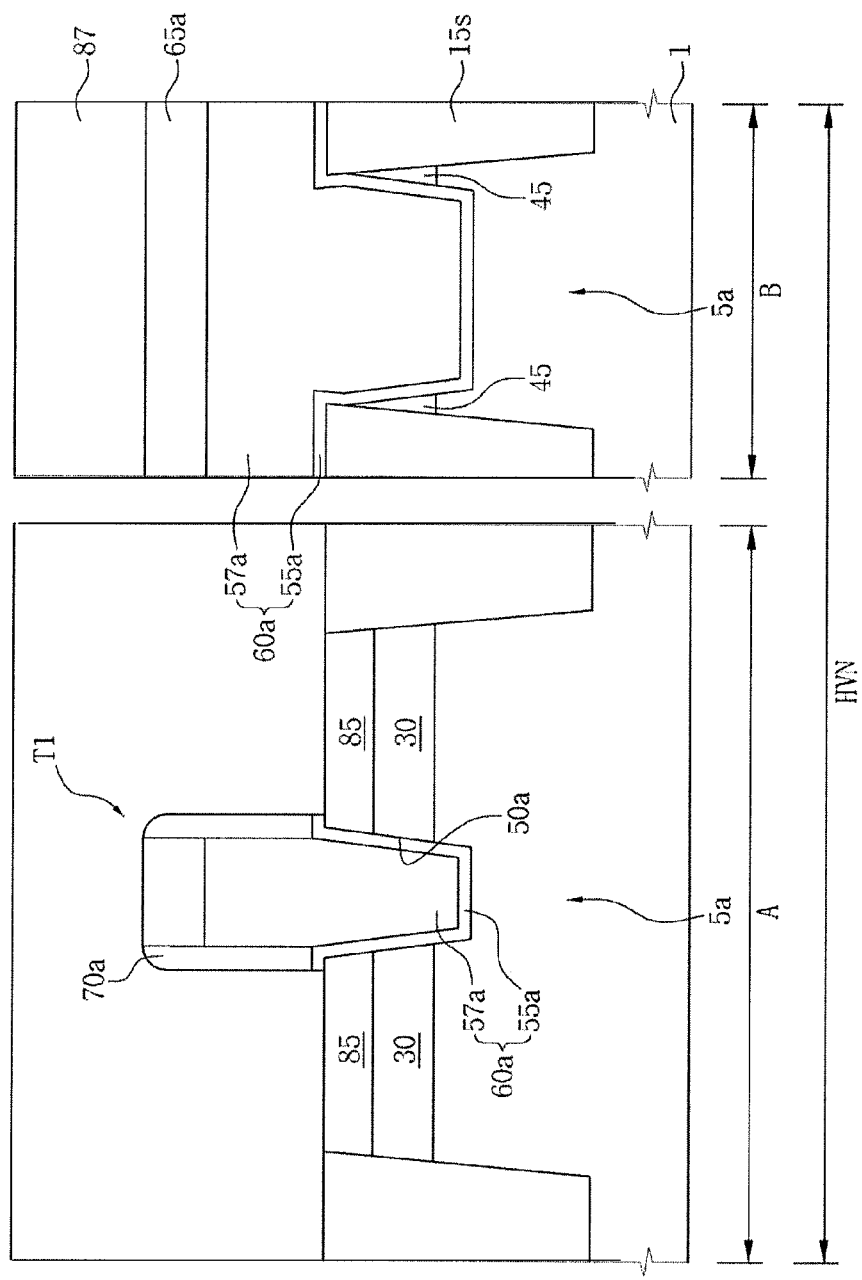
Figure 6B:
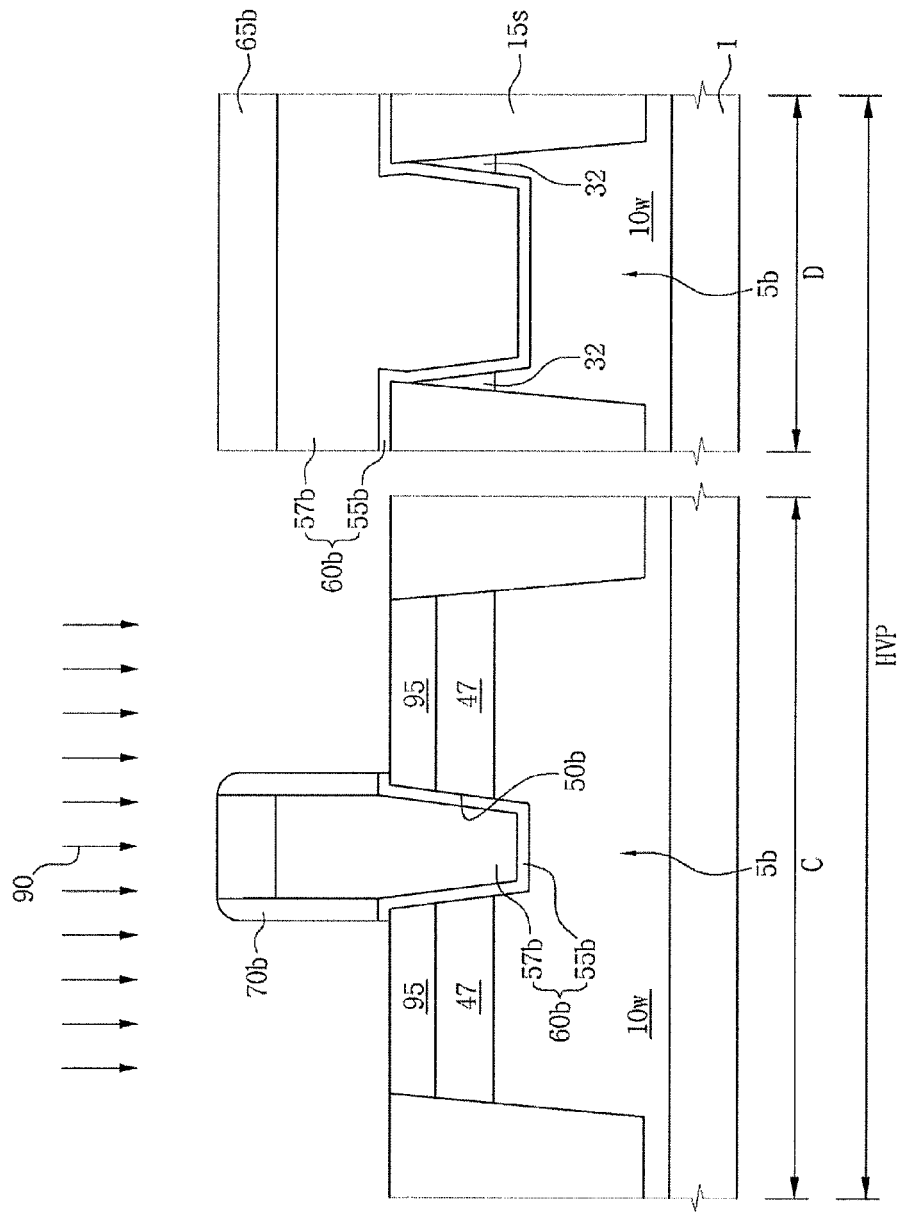

Referring to FIGS. 1, 6A, and 6B, the first photoresist pattern (refer to 75 in FIG. 5B) may be removed. A second photoresist pattern 87 may be formed to cover the first device region HVN of the semiconductor substrate 1 and expose the second device region HVP. A fourth ion implantation process 90 may be performed using the second photoresist pattern 87 as an ion implantation mask, thereby forming second source and drain regions 95 in the second active region 5b on both sides of the gate pattern 60b. The second source and drain regions 95 may have the same conductivity type as the second buffer region 47 and a higher impurity concentration than the second buffer region 47.

Figure 7A:
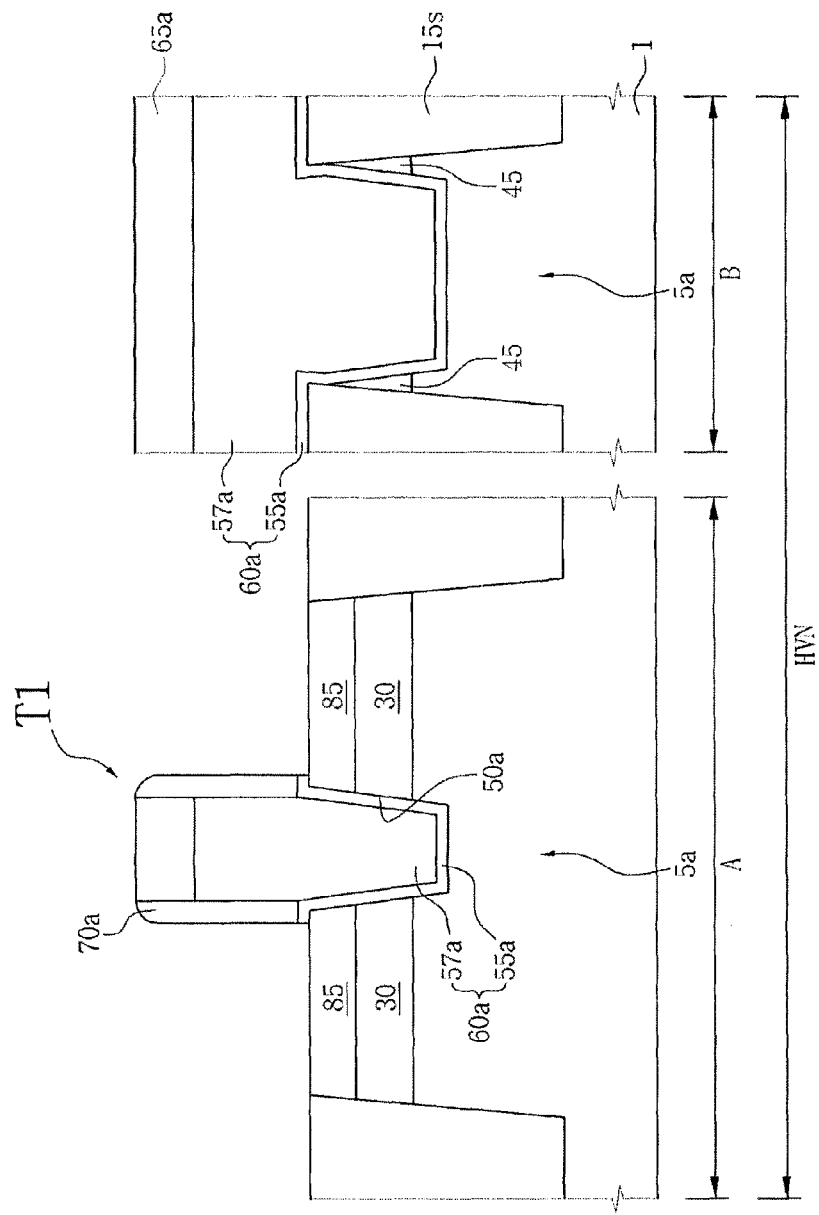
Figure 7B:
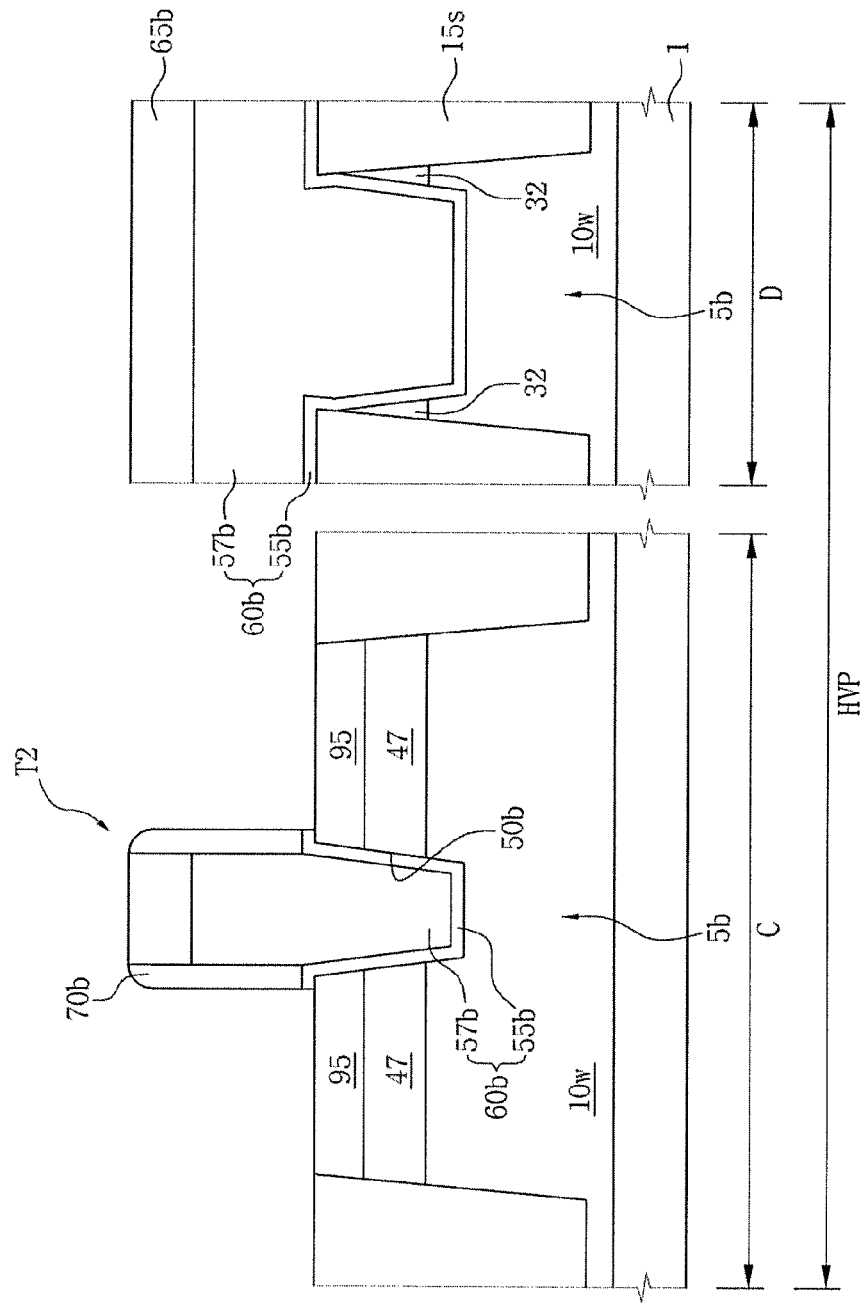

Referring to FIGS. 1, 7A, and 7B, the second photoresist pattern (refer to 87 in FIG. 6A) may be removed. Thus, a first MOS transistor T1 including the first gate pattern 60a, the first buffer region 30, and the first source and drain regions 85 may be formed in the first device region HVN. Also, a second MOS transistor T2 including the second gate pattern 60b, the second buffer region 47, and the second source and drain regions 95 may be formed in the second device region HVP.

As described above, in embodiments, the first threshold voltage control region 45 may remain in the first active region 5a under the side bottom portions 50as of the first gate trench 50a facing the isolation region 15s and/or under the first gate pattern 60a. Also, the first threshold voltage control region 45 may be formed to have the same conductivity type as the first active region 5a and a higher impurity concentration than the first active region 5a. Similarly, in embodiments, the second threshold voltage control region 32 may remain in the second active region 5b under the side bottom portions 50bs of the second gate trench 50b facing the isolation region 15s and/or under the second gate pattern 60b. Also, the second threshold voltage control region 32 may be formed to have the same conductivity type as the second active region 5b and a higher impurity concentration than the second active region 5b.

In embodiments, the first and second threshold voltage control regions 45 and 32 may prevent and/or reduce an occurrence of reductions in threshold voltages of the first and second MOS transistors T1 and T2 in the first and second threshold voltage control regions 43 and 32. That is, formation of humps in the first and second MOS transistors T1 and T2 may be reduced and/or prevented. Also, the first and second threshold voltage control regions 45 and 32 may prevent and/or reduce an occurrence of a leakage current in portions of the first and second active regions 5a and 5b disposed under the first and second gate patterns 60a and 60b adjacent to the isolation region 15s.

Hereinafter, an exemplary embodiment of a semiconductor device will be described with reference to FIGS. 7A and 7B.

Referring to FIGS. 1, 7A, and 7B, the semiconductor substrate 1 may include the first device region HVN and the second device region HVP. The first device region HVN may be a first high-voltage transistor region. The second device region HVP may be a second high-voltage transistor region. The semiconductor substrate 1 may be a bulk semiconductor wafer, a SOI wafer, etc., and may be formed of a semiconductor material, e.g., silicon. The first and second device regions HVN and HVP of the semiconductor substrate 1 may include well regions according to devices to be formed, for example, an NMOS transistor and/or a PMOS transistor. For example, the second device region HVP may have a second device well region 10w of a different conductivity type from the semiconductor substrate 1. An isolation region 15s defining first and second active regions 5a and 5b may be provided in the semiconductor substrate 1. The isolation region 15s may be a trench isolation layer. The first active region 5a may be defined in the first device region HVN. The second active region 5b may be defined in the second device region HVP.

The first active region 5a of the semiconductor substrate 1 may have a first conductivity type. The second active region 5b, and more particularly, the second device well region 10w, may have a second conductivity type that is different from the first conductivity type. For example, the first active region 5a may be a p type, and the second device well region 10w may be an n type. Alternatively, the first active region 5a may be an n type, and the second device well region 10w may be a p type. Thus, the first and second active regions 5a and 5b may have different conductivity types.

The first gate trench 50a may be disposed across the first active region 5a. The second gate trench 50b may be disposed across the second active region 5b. At least one of the first and second active regions 5a and 5b defined by the isolation region 15s and the first and second gate trenches 50a and 50b may have an inclined sidewall. Thus, the side bottom portions 50as of the first gate trench 50a adjacent to the isolation region 15s may be disposed at a higher level than the central bottom portion 50al of the first gate trench 50a. Also, the side bottom portions 50bs of the second gate trench 50b adjacent to the isolation region 15s may be disposed at a higher level than the central bottom portion 50bl of the second gate trench 50b.

First threshold voltage control regions 45 may be disposed in the first active region 5a under the bottom regions of the edge portions of the first gate trench 50a adjacent to the isolation region 15s. The first threshold voltage control regions 45 may have the same conductivity type as the first active region 5a and a higher impurity concentration than the first active region 5a. Similarly, second threshold voltage control regions 32 may have the same conductivity type as the second active region 5b, that is, the second device well region 10w, and a higher impurity concentration than the second device well region 10w.

The first gate dielectric layer 55a may be disposed on an inner wall, e.g., on the central bottom portion 50al and the side bottom portions 50as, of the first gate trench 50a. The second gate dielectric layer 55b may be disposed on an inner wall, e.g., the central bottom portion 50bl and the side bottom portions 50bs, of the second gate trench 50b. Each of the first and second gate dielectric layers 55a and 55b may include a silicon oxide layer and/or a high-k dielectric layer.

The first gate electrode 57a filling the first gate trench 50a may be disposed on the first gate dielectric layer 55a. The second gate electrode 57b filling the second gate trench 50b may be disposed on the second gate dielectric layer 55b. Each of the first and second gate electrodes 57a and 57b may include a Si layer, a SiGe layer, a Ge layer, a metal silicide layer, a metal nitride layer, and/or a metal layer, etc.

The first gate dielectric layer 55a and the first gate electrode 57a may be defined as the first gate pattern 60a. The second gate dielectric layer 55b and the second gate electrode 57b may be defined as the second gate pattern 60b. The first and second gate patterns 60a and 60b may at least partially fill the first and second gate trenches 50a and 50b, respectively. For example, the first and second gate patterns 60a and 60b may fill the first and second gate trenches 50a and 50b, respectively, and may protrude above top surfaces of the first and second active regions 5a and 5b, respectively.

The first buffer regions 30 and the first source and drain regions 85 may be disposed in the first active region 5a on both sides of the first gate pattern 60a. The first source and drain regions 85 may have the same conductivity type as the first buffer regions 30 and a higher impurity concentration than the first buffer regions 30. The first source and drain regions 85 may be disposed at a higher level than the first buffer regions 30 relative to the semiconductor substrate 1.

The second buffer regions 47 and second source and drain regions 95 may be disposed in the second active region 5b on both sides of the second gate pattern 60b. The second source and drain regions 95 may have the same conductivity type as the second buffer regions 47 and a higher impurity concentration than the second buffer regions 47. The second source and drain regions 95 may be disposed at a higher level than the second buffer regions 47 relative to the semiconductor substrate 1.

Embodiments may provide the first MOS transistor T1 including the first gate pattern 60a, the first buffer region 30, and the first source and drain regions 85 in the first device region HVN, and/or the second MOS transistor T2 including the second gate pattern 60b, the second buffer region 47, and the second source and drain regions 95 in the second device region HVP.

Embodiments may provide a threshold voltage control region under a gate pattern filling a gate trench in the active region and/or in an edge portion of an active region adjacent to an isolation region. The threshold voltage control region may have the same conductivity type as the active region and a higher impurity concentration than the active region. By providing a threshold voltage control region, embodiments may enable a reduction in a threshold voltage of a MOS transistor to be reduced and/or prevented in the threshold voltage control region. Embodiments may separately reduce and/or prevent a leakage current, during an off-state, in the edge portion of the active region, which is disposed adjacent to the isolation region under the gate pattern, by providing a threshold voltage control region.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a semiconductor device, comprising:
    preparing a semiconductor substrate including isolation regions defining first and second active regions, the first active region having a first conductivity type and the second active region having a second conductivity type that is different from the first conductivity type;
    forming first threshold voltage control regions in predetermined regions of the first active region, wherein the first threshold voltage control regions have the first conductivity type and have a higher impurity concentration than the first active region;
    forming a first gate trench extending across the first active region, wherein portions of side bottom portions of the first gate trench adjacent to the respective isolation region are disposed at a higher level than a central bottom portion of the first gate trench, and the first threshold voltage control regions remain in the first active region under the side bottom portions of the first gate trench adjacent to the respective isolation region; and
    forming a first gate pattern filling the first gate trench and covering the first threshold voltage control region,
    wherein the first gate trench extends deeper into the semiconductor substrate than the first threshold voltage control regions.

2. The method as claimed in claim 1, further including forming first buffer regions in the first active region before or after forming the first threshold voltage control regions,
    wherein the first buffer regions are of the second conductivity type and are formed in the first active region on opposing sides of the first gate pattern.

3. The method as claimed in claim 2, further including:
    forming second buffer regions in the second active region while forming the first threshold voltage control regions, wherein the second buffer regions are of the first conductivity type;
    forming second threshold voltage control regions in edge portions of the second active region adjacent to the respective isolation region while forming the first buffer regions, wherein the second threshold voltage control regions are of the second conductivity type and have a higher impurity concentration than the second active region;
    forming a second gate trench extending across the second active region while forming the first gate trench, wherein side bottom portions of the second gate trench adjacent to the respective isolation region are disposed at a higher level than a central bottom portion of the second gate trench, and the second threshold voltage control regions remain in the second active region under the side bottom portions of the second gate trench adjacent to the respective isolation region; and
    forming a second gate pattern filling the second gate trench and covering the second threshold voltage control regions while forming the first gate pattern,
    wherein the second buffer regions are formed in the second active region on opposing sides of the second gate pattern simultaneously with the first threshold voltage control regions, and the second threshold voltage control regions are formed simultaneously with the first buffer regions.

4. The method as claimed in claim 3, wherein the first gate pattern includes a first gate dielectric layer formed on an inner wall of the first gate trench and a first gate electrode disposed on the first gate dielectric layer, and the second gate pattern includes a second gate dielectric layer formed on an inner wall of the second gate trench and a second gate electrode disposed on the second gate dielectric layer.

5. The method as claimed in claim 3, further including forming first source and drain regions in the first active region on the opposing sides of the first gate pattern.

6. The method as claimed in claim 5, wherein the first source and drain regions are of the second conductivity type and have a higher impurity concentration than the first buffer regions.

7. The method as claimed in claim 3, further including forming second source and drain regions in the second active region on the opposing sides of the second gate pattern.

8. The method as claimed in claim 7, wherein the second source and drain regions are of the first conductivity type and have a higher impurity concentration than the second buffer regions.

9. The method as claimed in claim 3, wherein the first and second active regions are defined by the respective isolation regions and the respective first or second gate trenches, and at least one of the first and second active regions has an inclined sidewall.

10. A method of fabricating a semiconductor device, comprising:

preparing a semiconductor substrate including isolation regions defining first and second active regions, the first active region having a first conductivity type and the second active region having a second conductivity type that is different from the first conductivity type;

forming a first threshold voltage control region in the first active region and a second buffer region in the second active region, wherein the first threshold voltage control region and the second buffer region have the first conductivity type and are formed using the same ion implantation process;

forming a second threshold voltage control region in the second active region and a first buffer region in the first active region, wherein the second threshold voltage control region and the first buffer region have the second conductivity type and are formed using the same ion implantation process;

forming a first gate trench extending across the first active region, and a second gate trench extending across the second active region, wherein portions of side bottom portions of the first gate trench adjacent to the respective isolation region are disposed at a higher level than a central bottom portion of the first gate trench, the first threshold voltage control region remains in the first active region under the side bottom portions of the first gate trench adjacent to the respective isolation region, and the central bottom portion of the first gate trench directly contacts the first active region, wherein portions of side bottom portions of the second gate trench adjacent to the respective isolation region are disposed at a higher level than a central bottom portion of the second gate trench, and the second threshold voltage control region remains in the second active region under the side bottom portions of the second gate trench adjacent to the respective isolation region; and forming a first gate pattern filling the first gate trench and covering the remaining first threshold voltage control region, and a second gate pattern filling the second gate trench and covering the remaining second threshold voltage control region, wherein the remaining first threshold voltage control region has a higher impurity concentration than the first active region under the central portion of the first gate trench.

11. A method of fabricating a semiconductor device, comprising:

preparing a semiconductor substrate including an isolation region defining an active region, the active region having a first conductivity type;

forming a threshold voltage control region in the active region, wherein the threshold voltage control region has the first conductivity type;

forming a gate trench extending across the active region, wherein a portion of a side bottom portion of the gate trench adjacent to the isolation region is disposed at a higher level than a central bottom portion of the gate trench, the threshold voltage control region remains in the active region under the side bottom portion of the gate trench adjacent to the isolation region, and the central bottom portion of the gate trench directly contacts the active region, wherein the remaining threshold voltage control region has a higher impurity concentration than the active region under the central portion of the gate trench; and forming a gate pattern filling the gate trench and covering the remaining threshold voltage control region.

* * * * *